United States Patent [19]

Okai et al.

[11] 4,042,386

[45] Aug. 16, 1977

[54] PHOTOSENSITIVE COMPOSITIONS

[75] Inventors: Sakuo Okai; Koichi Kimoto, both of Kyoto, Japan

[73] Assignee: Napp Systems, San Marcos, Calif.

[21] Appl. No.: 693,306

[22] Filed: June 7, 1976

[51] Int. Cl.² .............................................. G03C 1/68
[52] U.S. Cl. ........................... 96/35.1; 96/115 P; 96/86 P
[58] Field of Search ............... 96/35.1, 86 P, 115 R, 96/115 P

[56] References Cited

U.S. PATENT DOCUMENTS 3,801,328 4/1974 Takimoto et al. ..................... 96/35.1

*Primary Examiner*—John D. Welsh
*Attorney, Agent, or Firm*—Hosier, Niro & Daleiden, Ltd.

[57] ABSTRACT

A photopolymerizable composition and photosensitive elements produced therefrom are disclosed which include a monomer component, a polymer component and a polymerization initiator activatable by actinic light. The monomer component includes at least one water soluble monofunctional unsaturated ethylenic monomer, and at least one polyfunctional unsaturated ethylenic monomer. The polymer component includes a partially saponified, water-soluble, polyvinyl acetate which is compatible with said monomer components. The ratio, by weight, of polyfunctional monomer to monofunctional monomer is in the range of about 0.2 to about 0.6, and the ratio, by weight, of said monomer component to said polymer component is in the range of about 0.7 to about 1.2.

18 Claims, No Drawings

PHOTOSENSITIVE COMPOSITIONS

BACKGROUND OF THE INVENTION

The present invention relates to photopolymerizable compositions and to photosensitive plates developable with water, said plates being directly utilizable as printing plates per se and also being useful for the production of relief images. More specifically, the present invention relates to a novel photosensitive plate which may be developed without the need for any pre-exposure conditioning and which provides a printing plate having improved printing characteristics.

Several photopolymerizable elements which are useful as printing plates have been disclosed in the prior art. One such disclosure is that of U.S. Pat. No. 3,801,328 issued to Takimoto et al. While the photopolymerizable compositions and elements disclosed in the Takimoto et al patent have met with considerable success, they nevertheless suffer from the disadvantage which is typical of prior art compositions and elements, that in order to produce a satisfactory relief image in such an element, it is necessary to subject the element to a pre-exposure conditioning. More specifically, the prior art teaches that when using photopolymer compositions of the type used in the present invention, it is necessary to reduce the presence of oxygen in the photopolymer in order to obviate the polymerization inhibition which oxygen effects during the exposure of the photopolymer to actinic light. The prior art teaches that such oxygen reduction or removal may be effected by $CO_2$ conditioning or by a brief light exposure or "bump exposure" immediately prior to the imagewise exposure of the photosensitive element. Of course, such preconditioning of the photosensitive elements results in greater processing costs and increased processing time and energy consumption.

SUMMARY OF THE INVENTION

The present invention relates to a photopolymerizable composition and a process for the development of such compositions wherein the need for the conditioning of the composition prior to imagewise exposure to actinic light is eliminated. Thus, the photopolymerizable compositions disclosed herein will provide satisfactory printing plates or relief images with only a single exposure to actinic light and without a prior $CO_2$ conditioning and/or bump exposure. In fact, it has been determined that the printing plates obtained in accordance with the present invention exhibit printing characteristics superior to those of the prior art plates such as those disclosed in the above-mentioned Takimoto et al patent.

One of the objects of the present invention is, therefore, to provide a new photopolymerizable composition. This composition comprises a monomer component, a polymer component and a polymerization initiator activatable by actinic light. The monomer component includes at least one water soluble monofunctional unsaturated ethylenic monomer and at least one polyfunctional unsaturated ethylenic monomer, these monomers being capable of forming a polymer by photoinitiated polymerization in the presence of a polymerization initiator activatable by actinic light. The polymer component includes a partially saponified, water-soluble, polyvinyl acetate polymer compatible with the monomers, containing both acetyl and hydroxyl groups, and having a polymerization degree of about 300 to 2,000, and a saponification degree of about 65 to 99 mole percent. Finally, the initiator comprises a benzoin alkylate which is compatible with the monomer and polymer components and is activatable by actinic light.

An important aspect of the present invention is the recognition that the ratios of the various components, coupled with the utilization of specific polyfunctional unsaturated ethylenic monomers, will allow the polymerization and development of the composition without pre-exposure conditioning. Thus, the composition of the present invention includes a monomer component wherein the ratio, by weight, of polyfunctional monomer to monofunctional monomer is in the range of from about 0.2 to about 0.6. In addition, the ratio, by weight, of monomer component to polymer component is in the range of from about 0.7 to about 1.2.

Another object of this invention is to provide a printing plate that is developable with water, yet is hard and durable and possesses other desirable printing properties.

Still another object of the invention is to provide photopolymerizable compositions which can be used as printing plates and also for relief images.

Still a further object of the present invention is to provide an expeditious process for the development of the printing plates and relief images disclosed herein.

These and other objects of the present invention, together with its attendant advantages, will become apparent to those skilled in the art from a consideration of the following detailed description and claims.

DETAILED DESCRIPTION OF THE INVENTION

The photopolymerizable composition of the present invention generally comprises the following three components: (a) at least one unsaturated ethylenic monomer, preferably having a boiling point above 100° C., a molecular weight below 1,500 and at least two polymerizable ethylenic groups, and being polymerizable by actinic light in the presence of a photopolymerization initiator; (b) a partially saponified polyvinyl acetate, namely a polymer having both acetyl groups and hydroxy groups produced by saponification of polyvinyl acetate and the like and being water-soluble and compatible with the monomer component (a); and (c) a photopolymerization initiator.

The monomer component used in the practice of this invention generally comprises a mixture of: (1) a monofunctional acrylic or methacrylic ester of a lower alkanol having one or more hydroxy groups, and (2) a polyfunctional acrylic or methacrylic ester of polyethylene glycol $[HO(CH_2CH_2O)_nH]$ which is etherified or esterified at one end thereof and wherein $n$ is one to eight. Examples of the monofunctional unsaturated ethylenic compound are B-hydroxyethel acrylate, B-hydroxyethyl methacrylate and B-hydroxypropyl acrylate. Examples of the polyfunctional monomer are methoxypolyethylene glycol monoacrylate, methoxypolyethylene glycol monomethacrylate, and polyethylene glycoldiester (e.g., polyethylene glycol diacrylate or polyethylene glycol dimethacrylate), being an acrylic or methacrylic half ester of polyethylene glycol and being etherified or esterified at the hydroxy group on the opposite side from the ester moiety of the molecule. In the said polyethylene glycol derivatives, $n$ is one to eight.

It should be recognized that the ethylenic unsaturated monomer component includes mixtures of both monoand polyfunctional compounds, the monofunctional compounds serving as solubilizing materials for the initiator component, and the polyfunctional compounds enhancing the adhesive characteristics of the resultant photopolymerizable composition. Thus, by using both the water-soluble monofunctional ethylenic unsaturated compound and polyfunctional ethylenic unsaturated compound, the highly desirable balance of properties, e.g., water-washability and high adhesion, can be imparted to the photopolymerizable composition.

As the initiator component b, benzoin alkylate compounds are used. Benzoin alkylate compounds are soluble in the ethylenic unsaturated component and are excellently compatible with the other components in the aqueous composition. Moreover, since benzoin alkylate compounds are not decomposed thermally below about 100° C., they do not harden or become insoluble with heating during the preparation of the photopolymerizable composition. Specific examples of the benzoin alkylate compounds found useful in the practice of this invention are methyl, ethyl, isopropyl, octyl, vinyl and allyl ethers of benzoin, i.e., benzoin methyl ether, benzoin ethyl ether, benzoin vinyl ether, benzoin allyl ether, etc. The presently preferred initiator is benzoin isopropyl ether because of its unexpectedly high solubility in the monomer components of this invention.

Although ordinary photopolymerization requires a photoinitiator such as anthraquinone compounds in addition to the polymerization initiators discussed above, a high photosensibility can be attained in the present invention without a photoinitiator such as anthraquinone but instead by using a benzoin alkylate initiator alone.

The polymer component used in the practice of this invention is a partially saponified polyvinyl acetate, preferably having an average degree of polymerization of 300 to 2,000 and a saponification degree of 65 to 99 mole percent. If a suitable partially saponified polyvinyl acetate cannot be obtained by saponifying polyvinyl acetate having a low saponification degree as a homopolymer, a copolymer obtained, for example, by copolymerizing vinyl acetate with maleic anhydride can be partially saponified to give the desired polymer. Saponification as used herein is intended to mean the conversion of ester groups or the like into alcohol groups and the saponification degree represents the extent to which ester groups or the like have been converted to alcohol or hydroxy groups.

The hardness of the obtained printing plate as well as the speed of washing out in the developing procedure depends directly on the degree of saponification. Thus to accomplish the desirable balance of properties referred to above, it is preferred that the partially saponified polyvinyl acetate have a degree of saponification within the stated range in saponifying polyvinyl acetate. There are some cases, for example, wherein a certain degree of saponification is required for compatibility with certain monomer components. Thus, it has been recognized that the required degree of saponification may be obtained by mixing two or more partially saponified polyvinyl acetate polymers having different degrees of saponification and calculating the arithmetic average of the different degrees of saponification. Mixtures of two or more polymers can be used, therefore, each having a different saponification degree; to obtain the desired average saponification degree for any given monomer component. This feature of the present invention adds significant flexibility to the formulation process and contributes significantly to the balance of properties that are desired for the photopolymerizable composition.

It is also desirable to add to the photopolymerizable composition of this invention about 0.01 to 0.3 percent, based upon the amount of the monomer component, of a thermal polymerization inhibitor.

Among the thermal polymerization inhibitors useful in the practice of this invention are 2,6 di-t-butyl-p-cresol, hydro quinone, and p-methoxyphenol. The preferred inhibitor is di-t-butyl-p-cresol because of its compatibility with the other components.

The novel photopolymerizable composition of the invention can be cast directly on the metallic and plastic supporting adhesive layer. In place of an antihalation layer, small amounts of dyestuffs may be added to the photopolymerizable composition. Sufficient amounts are added to the photopolymerizable composition just below that at which the composition becomes hazy. Examples of an effective dyestuff are rose bengal, eosine, methylene blue, and malachite green. These dyestuffs may be used solely or in combination in a ratio of 20 and to 150 ppm based on the amount of the photopolymerizable composition.

An aluminum plate or an iron plate may be used as the metallic base or support for the photopolymerizable composition. These plates should be previously subjected to a chemical treatment to prepare the surface thereof for strong adhesion with the photopolymerizable composition. This roughening or abrading of the plate surface, of course, eliminates the need for the separate anchor or adhesive layer previously employed. For example, an iron plate is treated with certain compounds to change its grey color into a light black color, whereby an antihalation function is imparted thereto. Whether an adhesive layer is present or not, the photopolymerizable layer changes from the liquid phase, via an intermediary gel phase, into a solid phase.

One important advantage of the present invention resides in the fact that photopolymerizable compositions of the type disclosed herein may be developed into printing plates and relief images with a single exposure to actinic light and without any pre-exposure conditioning. The printing plates and relief images after image exposure to actinic light may be developed with water and, in the case of printing plates, exhibit superior printing characteristics.

In accordance with the process of the present invention the photopolymerizable elements are exposed to a light source having an intensity at the surface of the exposed element in the range of from about 0.1 to about 0.2 watt per square inch and a wave length of about 360 nm. It is preferred that the intensity of the light source be in the range of from about 0.12 to about 0.17 watt per square inch. Photopolymerizable elements exposed to such a light have improved dot depth in hi-light, middle tone and shadow image areas. Such elements also exhibit improved minimum line widths and gray step characteristics.

Presently preferred and practical embodiments of the present invention are illustratively shown in the following examples, wherein all percentages and parts are by weight unless otherwise indicated.

Method A

An aluminum plate is immersed in a surface treating agent comprising sodium bichromate (1.0 part), concentrated sulfuric acid (10 parts) and water (30 parts) at 70 to 80 degrees Centigrade for about 20 minutes, the thus treated plate is then washed with water and dried.

Method B

A tin plate is immersed in a detergent comprising Ridoline (1.0 part; manufactured by Amchem Products, Inc.) and water (30 parts) at 65 degrees Centigrade for about 20 minutes. Then, the plate is washed with water and dried.

EXAMPLE 1

A mixture of partially saponified polyvinyl acetate (average polymerization degree, 500; saponification degree, 82.0 mol%) (35 parts), water (30 parts) and Rose bengal (50 ppm of all components by weight) is kneaded in a kneader at 80 to 90 degress Centigrade for 30 minutes. Then, this mixture is cooled to 60 degrees Centigrade and a mixture of diethylene glycol dimethacrylate (10 parts), B-hydroxyethyl methyacrylate (24 parts), hydroquinone (0.1 percent of total monomer by weight) and benzoin isopropyl ether (1.0 part) is added and stirred for 30 minutes. The resulting photopolymerizable composition is cast on an aluminum plate, approximately 10 mils, which has been treated as described in Method A.

A polyester sheet is placed thereon and the resulting piled product is passed between two rolls so as to provide a total thickness of 50 mils. After cooling, the polyester sheet is peeled off and the plate is dried in a dryer at 75° Centigrade for about one hour to give a photopolymer plate.

rylate (20 parts), p - methoxyhydroquinone (0.1 percent of total monomer by weight) and benzoin isopropyl ether (1.0 part) is added to this mixture and stirred for 30 minutes. This photopolymerizable composition is cast on an aluminum plate and dried to give a photopolymer plate.

The photopolymer plate made according to Example 1 is placed in a vacuum frame and the photopolymerizable surface is brought into contact with a line negative or a half tone negative. It is exposed to 0.125 watt of actinic radiation per square inch at the wave length of 360 nm. for 70 seconds from a distance of 20 inches. A 3,000 watt high pressure mercury arc is used as the light source. After exposure, the negative is stripped from the plate and the unexposed polymer is removed by spray washing with water (temperature, 120° Fahrenheit) under the pressure of 40 psi for 3 minutes. When the printing plate is dried at 230° Fahrenheit for 3 minutes to give a sharp relief printing plate. The printing plates thus prepared show excellent image quality and long press life when used for direct printing and also are utilizable as original plates for a paper mache.

As has been stated above, the formulation and processing carried out in accordance with the present invention provide a printing plate having superior printing characteristics to those of plates made in accordance with the prior art teachings. Table I shows certain printing plate characteristics and compares plates made substantially as described in Examples 1, 2 and 3 with plates made in accord with the teachings of the Takimoto et al patent mentioned in the Background of the Invention.

TABLE I

| | | With Bump Exposure | | | | | | Without Bump Exposure | | | | | |
| | | Prior Art | | | Examples | | | Prior Art | | | Examples | | |
|---|---|---|---|---|---|---|---|---|---|---|---|---|---|
| Dot Depth ($\mu$) | 10% Hi-Light | 270 | 260 | 250 | 240 | 240 | 240 | Loosing Dot | Loosing Dot | Loosing Dot | 240 | 240 | 240 |
| | 45% Middle Tone | 90 | 90 | 90 | 100 | 100 | 100 | 80 Plug Dot | 80 Plug Dot | 70 Plug Dot | 115 | 120 | 115 |
| | 90% Shadow | 30 | 30 | 30 | 50 | 50 | 50 | Plug Dot | Plug Dot | Plug Dot | 50 | 50 | 50 |
| Width of Minimum Remaining Line ($\mu$) | | 100 | 100 | 100 | 40 | 40 | 40 | 150 | 150 | 150 | 40 | 40 | 40 |
| Gray Step | | 15 | 15 | 15 | 17 | 17 | 17 | 13 | 13 | 13 | 17 | 17 | 17 |

EXAMPLE 2

The procedure of Example 1 is repeated except that tetraethylene glycol dimethacrylate (8 parts) is used in place of the diethylene glycol dimethacrylate to give a photopolymerizable composition which is cast on a tin plate as treated according to Method B. The plate is dried to give a photopolymer plate.

EXAMPLE 3

The procedure of Example 1 is repeated except that Eosin (80 ppm of all components by weight) is used in place of the Rose bengal to give a photopolymerizable composition which is cast on an aluminum plate as treated according to Method A. The plate is dried to give a photopolymer plate.

EXAMPLE 4

A mixture of partially saponified polyvinyl acetate (average polymerization degree, 500; saponification degree, 83.5 mol%) (33 parts), water (30 parts) and Eosin (60 ppm of all components by weight) is kneaded in a kneader at 80 to 90° Centigrade for 30 minutes. After cooling to 60° Centigrade, a mixture of diethylene glycol dimethacrylate (15 parts), γ-hydroxypropyl ac- Table I demonstrates that with bump exposure the plates made in accord with the present invention exhibit improved dot depth, minimum line thickness and gray step. In addition, without bump exposure, the plates of the present invention maintain their high quality whereas the prior art plates are unacceptable in many respects.

Of course, it should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

I claim:

1. A water-developable photopolymerizable composition, comprising: a monomer component including at least one water soluble monofunctional unsaturated ethylenic monomer, and at least one polyfunctional unsaturated ethylenic monomer selected from the group consisting of an acrylic or methacrylic ester of a polyethylene glycol having the structural formula [HO(CH$_2$CH$_2$O)$_n$H] wherein $n$, the number of ethylene oxide units in said polyethylene glycol ester, is one to eight, said monomers capable of forming a polymer by photoinitiated polymerization in the presence of a polymerization initiator activatable by actinic light; a polymer component including a partially saponified, water-soluble, polyvinyl acetate polymer compatible with said monomers, containing both acetyl and hydroxy groups, and having a polymerization degree of about 300 to 2,000, and a saponification degree of about 65 to 99 mole percent; and a photopolymerization initiator, compatible with said monomers and said polyvinyl acetate polymer, and activatable by actinic light; the ratio, by weight, of polyfunctional monomer to monofunctional monomer being in the range of from about 0.2 to about 0.6; and the ratio, by weight, of said monomer component to said polymer component being in the range of from about 0.7 to about 1.2.

2. The photopolymerizable composition of claim 1 wherein said partially saponified polyvinyl acetate polymer comprises one or more partially saponified polyvinyl acetate polymers having different saponification degrees, wherein the arithmetic average of the different saponification degrees, based upon the weight percent of each polymer, is within the range of about 65 to 99 mole percent.

3. A photopolymerizable composition according to claim 1 wherein said monomer component has a boiling point above about 100° C., a molecular weight below about 1,500 and at least two ethylenically unsaturated groups.

4. A photopolymerizable composition according to claim 1 further including small amounts of dyestuffs.

5. A photopolymerizable composition according to claim 1 wherein said monomer component comprises at least one monofunctional monomer selected from the group consisting of an acrylic or methacrylic ester of a lower alkanol having at least one hydroxy group.

6. A photopolymerizable composition according to claim 1 wherein the ratio, by weight, of polyfunctional monomer to monofunctional monomer is about 0.4.

7. A photopolymerizable composition according to claim 1, wherein said photopolymerization initiator is selected from the group consisting of benzoin methyl ether, benzoin ethyl ether, benzoin isopropyl ether, benzoin octyl ether, benzoin vinyl ether and benzoin allyl ether.

8. A photopolymer composition according to claim 7 wherein said photopolymerization initiator is benzoin isopropyl ether.

9. A photopolymerizable composition according to claim 1, further comprising about 0.01 to 0.3 percent by weight of a thermal polymerization inhibitor, based upon the weight of said monomer component.

10. A photopolymerizable composition according to claim 9, wherein said thermal polymerization inhibitor is selected from the group consisting of 2,6 di-t-butyl-p-cresol, hydroquinone and P-methoxyphyenol.

11. A photopolymer printing plate developable with water which comprises a support material and a layer of water soluble photosensitive resin composition disposed thereon; said composition comprising the following components: a mixture of a polyfunctional ethylenically unsaturated monomer selected from the group consisting of an acrylic or methacrylic ester of a polyethylene glycol having the structural formula [HO(CH$_2$CH$_2$O)$_n$] wherein $n$, the number of ethylene oxide units in said polyethylene glycol ester, is one to eight and at least one water soluble monofunctional ethylenically unsaturated monomer, said mixture of monomers being capable of forming polymer by photoinitiated polymerization in the presence of a polymerization initiator activatable by actinic light, a partially saponified polyvinyl acetate having a degree of polymerization of about 300 to 2,000 and a degree of saponification of about 65 to 99 mole percent, and a benzoin alkylate initiator activatable by actinic light; the ratio, by weight, of polyfunctional monomer to monofunctional monomer being in the range of from about 0.2 to about 0.6, and the ratio of said mixture of monomers to said polyvinyl acetate being in the range of from about 0.7 to about 1.2.

12. A photopolymer printing plate according to claim 11, further comprising about 0.01 to 0.3 percent by weight of a thermal polymerization inhibitor, based upon the weight of said mixture of monomers.

13. A photopolymer printing plate according to claim 11, wherein the partially saponified polyvinyl acetate comprises one or more partially saponified polyvinyl acetate polymers having different degrees of saponification and different degrees of polymerization, wherein the average degree of polymerization is 300 to 2,000 and average saponification degree is 65 to 99 mole percent.

14. A photopolymer printing plate according to claim 11, wherein said support material is a chemically or mechanically abraded metallic and/or plastic plate.

15. A photopolymer printing plate according to claim 11, wherein said support material is a metallic and/or plastic plate.

16. A process for developing a photopolymer plate which includes a layer of photosensitive resin composition comprising a mixture of a polyfunctional ethylenically unsaturated monomer selected from the group consisting of an acrylic or methacrylic ester of a polyethylene glycol having the structural formula [HO(CH$_2$CH$_2$O)$_n$H] wherein $n$ is the number of ethylene oxide units in said polyethylene glycol ester, is one to eight and at least one water soluble monofunctional ethylenically unsaturated monomer, said mixture of monomers being capable of forming polymer by photoinitiated polymerization in the presence of a polymerization initiator activatable by actinic light, a partially saponified polyvinyl acetate having a degree of polymerization of about 300 to 2,000 and a degree of saponification of about 65 to 99 mole percent, and a benzoin alkylate initiator activatable by actinic light; the ratio, by weight, of polyfunctional monomer to monofunctional monomer being in the range of from about 0.2 to about 0.6, and the ratio of said mixture of monomers to said polyvinyl acetate being in the range of from about 0.7 to about 1.2, said process comprising the steps of:
  subjecting said plate to a single exposure of actinic light having an intensity at the plate surface of from about 0.1 to about 0.2 watt per square inch and a wave length of about 360 nm;
  removing the unexposed resin composition from said plate by washing with water; and
  drying said plate.

17. The process of claim 16 wherein said light intensity is in the range of from about 0.12 to about 0.17 watt per square inch.

18. The process of claim 16 wherein said unexposed resin composition is removed from said plate by spray washing with water.

* * * * *